(12) United States Patent
Dong et al.

(10) Patent No.: US 7,737,487 B2
(45) Date of Patent: Jun. 15, 2010

(54) NONVOLATILE MEMORIES WITH TUNNEL DIELECTRIC WITH CHLORINE

(75) Inventors: Zhong Dong, Fremont, CA (US); Barbara Haselden, Cupertino, CA (US)

(73) Assignee: Promos Technologies Pte. Ltd., Singapore (SG)

( * ) Notice: Subject to any disclaimer, the term of this patent is extended or adjusted under 35 U.S.C. 154(b) by 92 days.

(21) Appl. No.: 12/134,834

(22) Filed: Jun. 6, 2008

(65) Prior Publication Data

US 2009/0303787 A1    Dec. 10, 2009

(51) Int. Cl.
*G11C 11/34* (2006.01)
*H01L 29/792* (2006.01)
*H01L 21/336* (2006.01)

(52) U.S. Cl. .............. 257/324; 365/184; 438/591; 257/E29.309; 257/E21.423

(58) Field of Classification Search ......... 257/314–316, 257/321–322, 324–325, 510, E21.209, E21.21, 257/E21.422, E21.423, E21.409, E21.679, 257/E21.682, E29.129, E29.302, E29.309; 438/264, 287, 266; 365/184

See application file for complete search history.

(56) References Cited

U.S. PATENT DOCUMENTS

| 2006/0261401 A1 | 11/2006 | Bhattacharyya | |
|---|---|---|---|
| 2007/0004136 A1* | 1/2007 | Dong et al. | 438/257 |
| 2008/0290398 A1* | 11/2008 | Polishchuk et al. | 257/324 |

* cited by examiner

*Primary Examiner*—Victor A Mandala
*Assistant Examiner*—Whitney Moore
(74) *Attorney, Agent, or Firm*—Haynes and Boone, LLP; Michael Shenker

(57) ABSTRACT

In a nonvolatile memory cell with charge trapping dielectric (150), the tunnel dielectric (140) includes chlorine adjacent to the charge trapping dielectric but no chlorine (or less chlorine) adjacent to the cell's channel region (120). The chlorine adjacent to the charge trapping dielectric serves to improve the programming and/or erase speed. The low chlorine concentration adjacent to the channel region prevents chlorine from degrading the data retention. Other features are also provided.

20 Claims, 4 Drawing Sheets

NONVOLATILE MEMORIES WITH TUNNEL DIELECTRIC WITH CHLORINE

BACKGROUND OF THE INVENTION

The present invention relates to integrated circuits, and more particularly to nonvolatile memories with charge-trapping dielectric.

Some nonvolatile memories include charge-trapping dielectric separated from a conductive region (e.g. doped silicon substrate) by tunnel dielectric. The memory state is defined by the charge in the charge-trapping dielectric. To change the memory state, a suitable voltage is applied to cause charge transfer through the tunnel dielectric between the charge-trapping dielectric and the conductive region. In order to provide good data retention, the charge leakage should be low when no voltage is not applied, so the tunnel dielectric should be sufficiently thick. However, the thick tunnel dielectric impedes the charge transfer when the voltage is applied, thus making memory write operations slow. See e.g. U.S. patent application Ser. No. 11/131,006 filed May 17, 2005 by Bhattacharyya, published as no. 2006/0261401 on Nov. 23, 2006, incorporated herein by reference.

SUMMARY

This section summarizes some features of the invention. Other features may be described in the subsequent sections. The invention is defined by the appended claims, which are incorporated into this section by reference.

The inventors have discovered that the memory writing speed can be increased while providing good data retention if the tunnel dielectric is treated with chlorine adjacent to the charge-trapping dielectric but not adjacent to the conductive region. For example, in some embodiments, the charge-trapping dielectric is silicon nitride, the tunnel dielectric is silicon dioxide, and the conductive region is doped silicon. The tunnel dielectric includes chlorine adjacent to the silicon nitride but not adjacent to the doped silicon. Chlorine provides low energy states that speed up charge transfer between the silicon nitride and the silicon when a writing voltage is applied. Chlorine is absent adjacent to the silicon however to keep the charge leakage down.

The invention is not limited to the features and advantages described above except as defined by the appended claims.

DESCRIPTION OF SOME EMBODIMENTS

The embodiments described in this section illustrate but do not limit the invention. The invention is defined by the appended claims.

Figure 1:
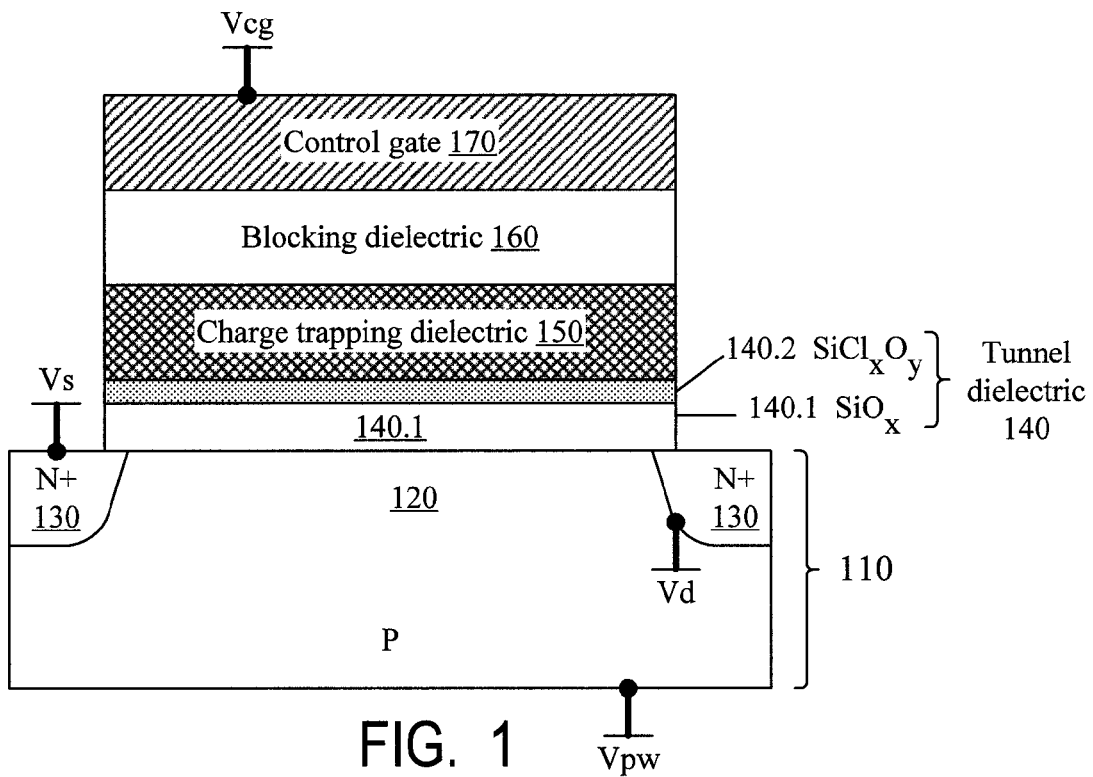
FIG. 1 shows a vertical cross section of a memory cell according to some embodiments of the present invention.

FIG. 1 shows a vertical cross section of a nonvolatile memory cell according to some embodiments of the present invention. Semiconductor region 110 is a conductive region, e.g. monocrystalline silicon substrate containing a P type channel region 120 and N type source/drain regions 130. Tunnel dielectric 140 includes lower portion 140.1 in contact with semiconductor region 110 (with channel region 120 and possibly regions 130) and also includes upper portion 140.2 in contact with charge-trapping dielectric 150. Dielectric 150 can be silicon nitride (with or without suitable nanocrystals) or other material or materials such as disclosed for example in U.S. patent application Ser. No. 11/131,006 filed May 17, 2005 by Bhattacharyya, published as no. 2006/0261401 A1 on Nov. 23, 2006, incorporated herein by reference. Tunnel dielectric portion 140.1 can be silicon oxide, possibly nitrided (e.g. SiON or more generally $SiO_xN_y$) to block chlorine diffusion from portion 140.2. Tunnel dielectric portion 140.2 can be silicon chlorine oxide ($SiCl_xO_y$). In some embodiments, portion 140.1 is thicker than portion 140.2.

Blocking dielectric 160 (e.g. a thick layer of silicon dioxide or some other material, see e.g. the aforementioned U.S. patent application Ser. No. 11/131,006) separates the charge trapping dielectric 150 from control gate 170 (e.g. tantalum, doped polysilicon, or some other conductive material).

The memory can be fabricated using a combination of known processes. In some embodiments, layer 140.1 is silicon dioxide formed by thermal oxidation or CVD (e.g. HTO) of P type monocrystalline silicon substrate 110. As noted above, layer 140.1 can include nitrogen, and can be ONO for example.

Then $SiCl_xO_y$ 140.2 is deposited, e.g. by chemical vapor deposition (CVD) from DCS (dichlorosilane) and $N_2O$, or from $SiCl_4$ and $H_2O$, or by thermal oxidation in a furnace in the presence of chlorine or chlorine compound such as vapor HCl or TLC (trans 1,2-dichloroethane) or TCA (trichloroethylene, also known as TCE). Alternatively, layer 140.2 can initially be formed as chlorine-free silicon dioxide (e.g. by thermal oxidation or CVD) and later chlorinated with a plasma process (in an etch chamber for example). Other techniques may also be suitable. An exemplary chlorine concentration is 3 to 20% (atomic percent).

In some embodiments, the thickness of layer 140.2 is 0~5 nm. In some embodiments, this layer is at most 1 nm thick. In some embodiments, layer 140.1 is 1~2 nm thick, and layer 140.2 is 0.5~1 nm thick, for the total thickness of tunnel dielectric 140 not exceeding 2.5 nm. This thickness is appropriate for direct tunneling in both the programming and erase operations. Direct tunneling can advantageously be performed at low voltages (compared to Fowler-Nordheim tunneling) and is fairly gentle to the silicon substrate and the tunnel dielectric (compared to hot electron or hot hole injection).

Charge trapping dielectric 150 (e.g. silicon nitride), blocking dielectric 160, and control gate 170 can be formed using known techniques. The layers employed can be patterned using known processes.

In some embodiments, layer 140 has a higher band gap than each of channel 120 and charge trapping dielectric 150. The chlorine in layer 140.2 is believed to provide low energy states which speed up programming and erase operations. In some embodiments, these energy states have higher energy than the lower edge of the conduction band of charge trapping dielectric 150.

Figure 2:
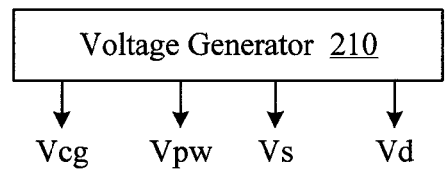
FIG. 2 is a block diagram of an exemplary voltage generator suitable for the memory cell of FIG. 1.

FIG. 2 is a block diagram of a voltage generator 210 which generates source and drain voltages Vs, Vd for respective source/drain regions 130, a control gate voltage Vcg for control gate 170, and a substrate voltage Vpw for the channel region 120 (possibly located in a P well). In some embodiments, the voltage generator receives a signal identifying a memory access operation (e.g. program, erase or read) and generates the voltages as appropriate. In some embodiments, the memory cell is programmed by charge transfer between channel 120 and charge trapping dielectric 150 through tunnel dielectric 140. The charge transfer can be direct and/or FN tunneling of electrons from channel region 120 into the charge trapping dielectric, and can be induced by a positive voltage between control gate 170 and channel 120 (Vcg>Vpw). The source/drain regions 130 can be floating. Alternatively, the charge transfer can be hot electron injection generated by raising Vcg above Vpw and providing a voltage difference between the source/drain regions 130. The memory can be erased by the reverse charge transfer (induced by providing Vcg<Vpw) in a direct or FN tunneling operation or by hot hole injection. The memory can be read by providing a voltage difference between the source/drain regions 130 with Vcg above Vpw and sensing the current flowing through at least one of the source/drain regions. Other types of operation and other memory cell architectures are possible. For example, a select gate can be provided for a split-gate architecture.

FIGS. 3, 4, 5A, 5B, 6A, 6B illustrate improvements that have been observed in memories using a partially chlorinated tunnel dielectric 140 described above in connection with FIG. 1. The data of FIGS. 3, 4, 5A, 5B, 6A, 6B were obtained using capacitor structures, i.e. the memory cells were as in FIG. 1 but without source/drain regions 130. Each memory cell (capacitor cell) had dimensions 200 μm×300 μm. (The invention is believed to be suitable for larger and smaller dimensions too however, e.g. 35 nm×35 nm.)

The data of FIGS. 3, 4, 5A, 5B, 6A, 6B indicate performance of "new" cells (with chlorine in tunnel dielectric 140) versus "old" cells (without chlorine in tunnel dielectric 140). The "new" cells were fabricated as follows. Substrate 110 was monocrystalline silicon doped with boron. The dopant concentration was $2*10^{15}$ atoms/cm$^3$. Tunnel dielectric layer 140.1 was thermal silicon dioxide, formed by ISSG (in-situ steam generation) to a thickness of 1.8 nm. Layer 140.2 was silicon dioxide formed by LPCVD (low pressure chemical vapor deposition) and doped in-situ with chlorine. The thickness of layer 140.2 was 0.5 nm. Charge trapping layer 150 was silicon oxynitride (SiON) formed by LPCVD to a thickness of 8 nm. Blocking dielectric 160 was silicon dioxide deposited by HTO (high temperature oxidation) to a thickness of 6 nm. Control gate 170 was N+ doped amorphous silicon formed by CVD (chemical vapor deposition) to a thickness of 120 nm.

The "old" cells were identical to the new cells except that the layer 140.2 was omitted.

Figure 3:
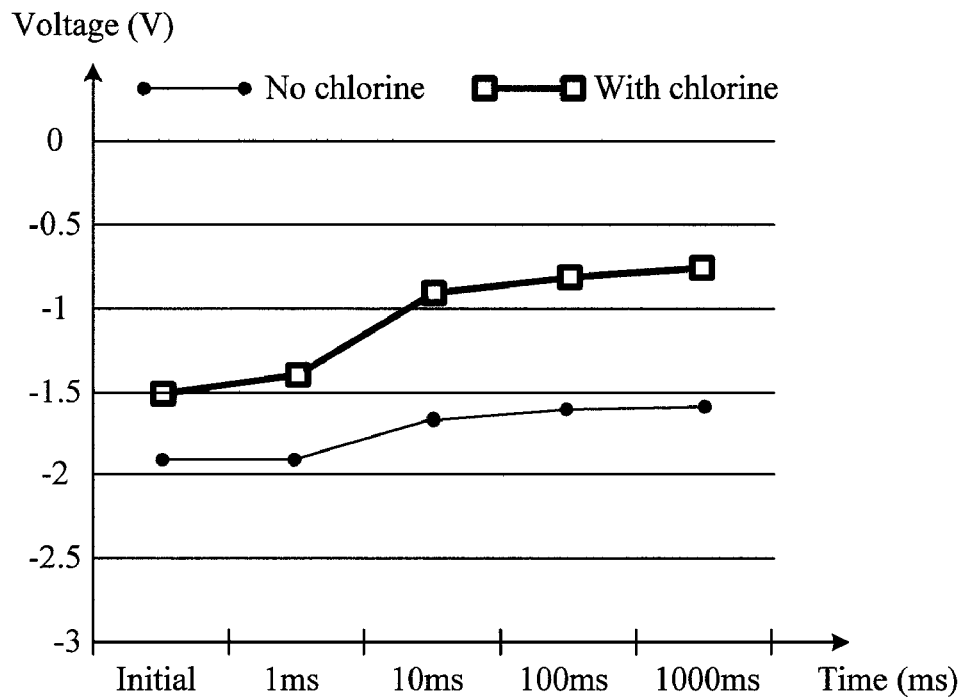
FIGS. 3, 4, 5A, 5B, 6A, 6B show experimental data obtained for memory cells with chlorine according to some embodiments of the present invention versus similar cells without chlorine.

FIG. 3 illustrates the programming speed of a "new" cell ("With chlorine") versus an "old" cell ("No chlorine"). The vertical axis indicates the flat band voltage $V_{FB}$ measured by a high-frequency CV test. As is well known, $V_{FB}$ is a component of the threshold voltage. The programming was performed with Vg=12V, Vpw=0V. As illustrated in FIG. 3, the new cell's $V_{FB}$ changed by more than 0.5V within 10 ms (from −1.5V to more than −1V), while the old cell's $V_{FB}$ changed by less than 0.5V even after more than 100 ms.

Figure 4:
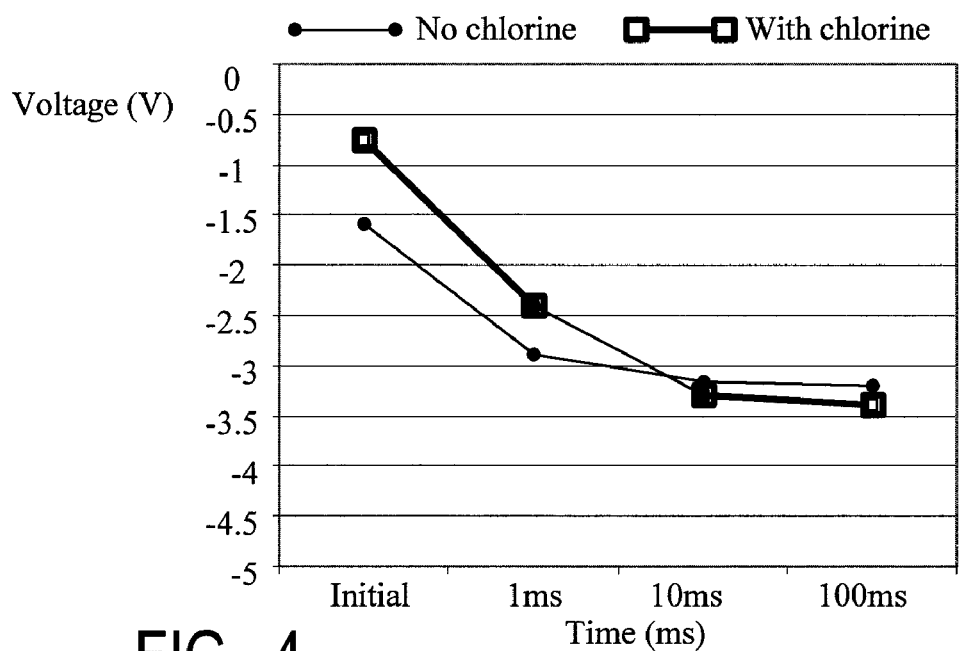

The erase speed difference (measured as the $V_{FB}$ change) is also significant as illustrated in FIG. 4.

Figure 5A:
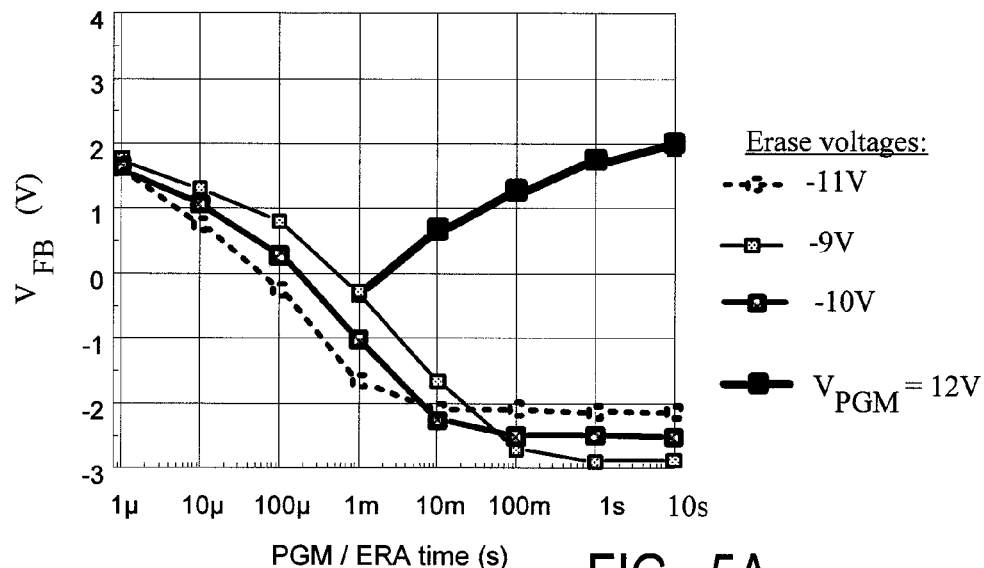
Figure 5B:
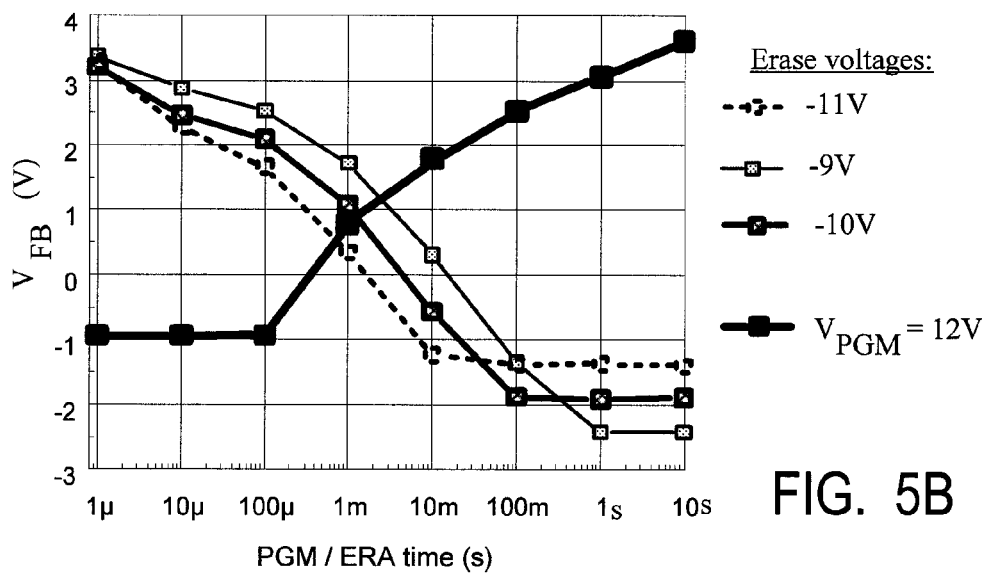

FIG. 5A shows additional data for the programming and erase speed for old cells. The erase operations were performed at the voltage Vcg−Vpw of −11V, −9V, and −10V. The programming was performed at voltage $V_{PGM}$=Vcg−Vpw=12V. FIG. 5B indicates the same type of data for new cells. On the horizontal axes, the microsecond and millisecond units are as "μ" and "m" respectively. The vertical axes show $V_{FB}$ in volts. The comparison shows significant improvements in the speed of the $V_{FB}$ change for the new cells. For example, for the erase operation of a given duration, the $V_{FB}$ change can be 4.4V in the new cell versus 3.8V for the old cell.

Figure 6A:
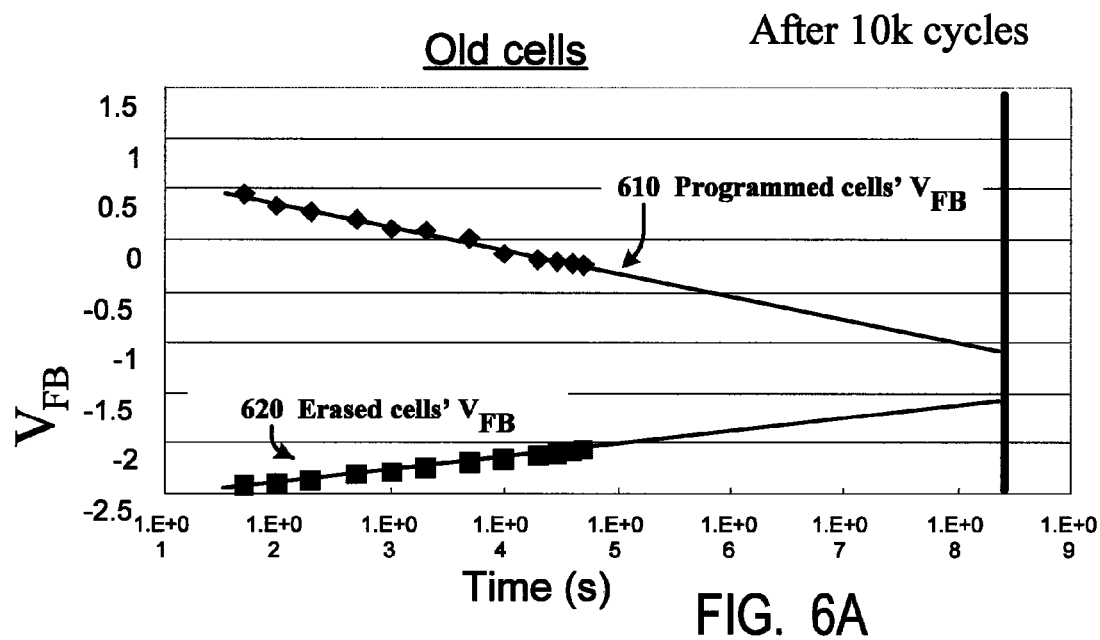
Figure 6B:
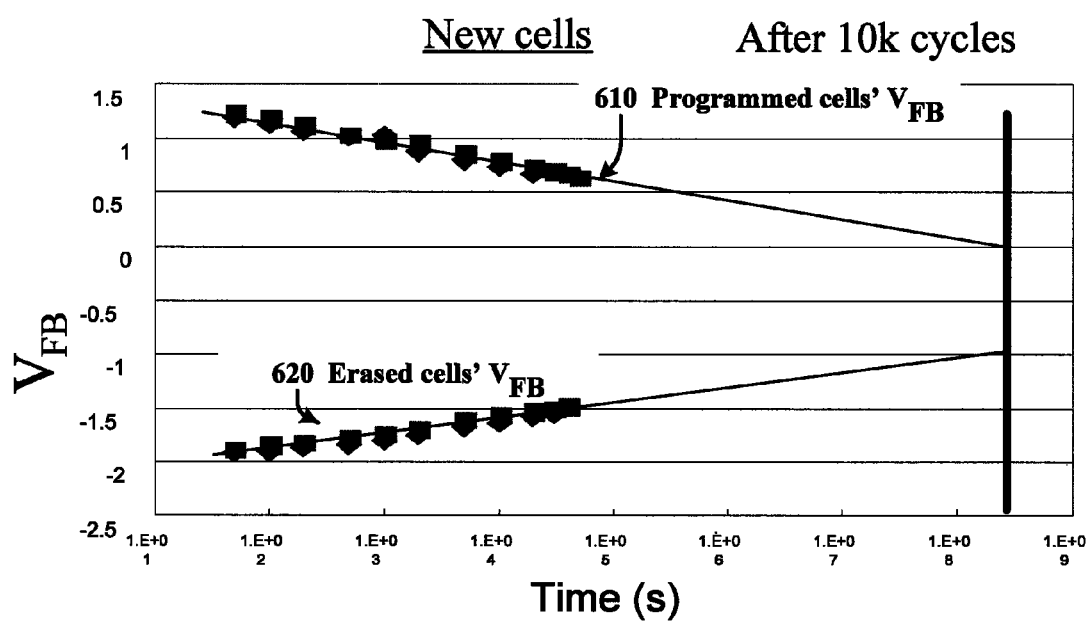

FIGS. 6A, 6B illustrate tests for data retention as measured by the stability of the difference between the programmed and erased $V_{FB}$ voltages over a period of time. FIG. 6A relates to the old cells, and FIG. 6B to the new cells. FIG. 6A shows the flat band voltage $V_{FB}$ as a function of time for a programmed old cell (at 610) and for an erased old cell (at 620). Each cell was subjected to 10000 program/erase cycles, then left in the respective programmed or erased state. Then $V_{FB}$ was periodically measured during a time period starting at some time between 10 and 100 seconds on the time axis and ending at a time between $10^4$ and $10^5$ seconds (i.e. between 1.0E+04 and 1.0E+5 seconds). Then $V_{FB}$ was linearly extrapolated to a time point of over $10^8$ seconds (i.e. about 10 years). As shown in FIG. 6A, in about 10 years the $V_{FB}$ difference between the programmed and erased cells decreases from about 3V (i.e. 0.5V−(−2.5V)) to about 0.5V.

FIG. 6B shows similar data for the new cells. Lines 610, 620 show the $V_{FB}$ for the programmed and erased states respectively. In about 10 years, the $V_{FB}$ difference between the programmed and erased cells decreases from about 3V to about 1V. In contrast, for the old cells, the 1V difference in the $V_{FB}$ voltage is reached in only about 0.2 years as shown in FIG. 6A.

Some embodiments of the present invention provide an integrated circuit comprising: a first conductive region of semiconductor material (e.g. channel region 120); a tunnel dielectric for a nonvolatile memory cell in physical contact with the first conductive region, the tunnel dielectric comprising a first portion (e.g. 140.1) which comprises silicon and oxygen atoms and is adjacent to the first conductive region, the tunnel dielectric comprising a second portion (e.g. 140.2) separated from the first conductive region by the first portion and comprising silicon and chlorine and having a greater atomic percentage of chlorine than the first portion. The first portion may have zero concentration of chlorine, but may also have positive chlorine concentration. The integrated circuit further comprises a charge-trapping dielectric for the nonvolatile memory cell in physical contact with the tunnel dielectric; and a conductive gate for the nonvolatile memory cell.

The invention is not limited to the embodiments described above. Other embodiments and variations are within the scope of the invention, as defined by the appended claims.

The invention claimed is:

1. An integrated circuit comprising:
    a first conductive region of semiconductor material;
    a tunnel dielectric for a nonvolatile memory cell in physical contact with the first conductive region, the tunnel dielectric comprising a first portion which comprises silicon and oxygen atoms and is adjacent to the first conductive region, the tunnel dielectric comprising a second portion separated from the first conductive region by the first portion and comprising silicon and chlorine and having a greater atomic percentage of chlorine than the first portion;
    a charge-trapping dielectric for the nonvolatile memory cell in physical contact with the tunnel dielectric; and
    a conductive gate for the nonvolatile memory cell.

2. The integrated circuit of claim 1 further comprising a blocking dielectric separating the conductive gate from the charge-trapping dielectric.

3. The integrated circuit of claim 1 wherein the first portion has a zero concentration of chlorine.

4. The integrated circuit of claim 3 wherein the atomic percentage of chlorine in the second portion is 3 to 20%.

5. The integrated circuit of claim 3 wherein the first portion is thicker than the second portion.

6. The integrated circuit of claim 1 wherein the first portion comprises nitrogen atoms.

7. The integrated circuit of claim 1 wherein the second portion comprises nitrogen or oxygen atoms.

8. The integrated circuit of claim 7 wherein the first conductive region is a doped silicon region, the first portion is made of one or more compounds each of which comprises silicon and at least one of oxygen and nitrogen, and the second portion is made of one or more compounds each of which comprises silicon and at least one of oxygen, nitrogen and chlorine and at least one of which comprises chlorine.

9. A method for operating the integrated circuit of claim 1, the method comprising reading the nonvolatile memory cell and/or changing a state of the memory cell.

10. The method of claim 9 comprising changing the state of the memory cell, wherein changing the state comprises providing a voltage between the conductive gate and the first conductive region to cause charge transfer between the first conductive region and the charge trapping dielectric.

11. The integrated circuit of claim 1 wherein the atomic percentage of chlorine in the second portion is 3 to 20%.

12. The integrated circuit of claim 1 wherein the first portion is thicker than the second portion.

13. The integrated circuit of claim 1 wherein the first portion physically contacts the conductive region and the second portion physically contacts the charge-trapping dielectric.

14. A method for fabricating an integrated circuit, the method comprising:

forming a tunnel dielectric for a nonvolatile memory cell in physical contact with a first conductive region of semiconductor material, the tunnel dielectric comprising a first portion which comprises silicon and oxygen atoms and is adjacent to the first conductive region, the tunnel dielectric comprising a second portion separated from the first conductive region by the first portion and comprising silicon and chlorine and having a greater atomic percentage of chlorine than the first portion;

forming a charge-trapping dielectric for the nonvolatile memory cell in physical contact with the tunnel dielectric; and forming a conductive gate for the nonvolatile memory cell.

15. The method of claim 14 further comprising forming a blocking dielectric separating the conductive gate from the charge-trapping dielectric.

16. The method of claim 14 wherein the first portion has a zero concentration of chlorine.

17. The method of claim 16 wherein the atomic percentage of chlorine in the second portion is 3 to 20%.

18. The method of claim 14 wherein the first portion comprises nitrogen atoms.

19. The method of claim 14 wherein the second portion comprises nitrogen or oxygen atoms.

20. The method of claim 19 wherein the first conductive region is a doped silicon region, the first portion is made of one or more compounds each of which comprises silicon and at least one of oxygen and nitrogen, and the second portion is made of one or more compounds each of which comprises silicon and at least one of oxygen, nitrogen and chlorine and at least one of which comprises chlorine.

* * * * *